(12) United States Patent
Gluszek

(10) Patent No.: US 6,541,954 B1
(45) Date of Patent: Apr. 1, 2003

(54) CIRCUIT APPARATUS FOR SENSING LINE CONDITIONS IN A THREE PHASE POWER LINE

(75) Inventor: Andrzej Julian Gluszek, Liverpool, NY (US)

(73) Assignee: SSAC, Inc., Baldwinsville, NY (US)

( * ) Notice: Subject to any disclaimer, the term of this patent is extended or adjusted under 35 U.S.C. 154(b) by 0 days.

(21) Appl. No.: 09/574,981

(22) Filed: May 19, 2000

Related U.S. Application Data

(60) Provisional application No. 60/136,891, filed on Jun. 1, 1999.

(51) Int. Cl.[7] .................. G01R 29/16; G01R 19/22; G05F 1/573; G05D 9/00
(52) U.S. Cl. .................. 324/107; 324/119; 323/277; 700/293
(58) Field of Search .................. 324/107, 86, 87, 324/119; 361/10, 30, 31, 79; 700/293, 294; 702/60, 64; 323/277

(56) References Cited

U.S. PATENT DOCUMENTS

| | | | |
|---|---|---|---|
| 3,611,050 A | 10/1971 | Weber | |
| 4,331,995 A | 5/1982 | Voss | |
| 4,333,119 A | * 6/1982 | Schoenmeyr | ............... 361/76 |
| 4,379,317 A | 4/1983 | Conroy, Jr. et al. | |
| 4,584,623 A | 4/1986 | Bello et al. | |
| 4,724,503 A | 2/1988 | Libert | |
| 4,825,328 A | 4/1989 | Izaguirre, Sr. | |
| RE33,874 E | * 4/1992 | Miller | ............... 361/79 |
| 5,151,854 A | 9/1992 | Adams et al. | |
| 5,298,853 A | 3/1994 | Ryba | |
| 5,337,206 A | 8/1994 | Kadah et al. | |
| 5,548,207 A | 8/1996 | Smith | |
| 5,768,079 A | 6/1998 | Buell | |
| 5,814,955 A | 9/1998 | Bauer et al. | |
| 5,955,859 A | 9/1999 | Baurand et al. | |
| 6,236,197 B1 | * 5/2001 | Holdsclaw et al. | ......... 324/110 |

* cited by examiner

Primary Examiner—Christine Oda
Assistant Examiner—Anjan K. Deb
(74) Attorney, Agent, or Firm—George S. Blasiak; Wall Marjama & Bilinski LLP

(57) ABSTRACT

The present invention is a power monitoring circuit for sensing line conditions in a three phase power line. In the circuit a plurality of series connected power supplies for powering various components of the circuit are connected in series with a current sensing element for sensing current supplied to the power supplies. The power supply and current sensing element arrangement, in turn, is connected across a three phase bridge rectifier, which is in communication with the three phase power supply line. A circuit analyzer in communication with the current sensing element senses unbalanced line conditions based at least in part on a signal developed by the current sensing element. Preferably, the circuit further includes a three voltage reducing resistors interposed between the three phase power line and the bridge rectifier for reducing the voltage stresses encountered by the circuit's components.

62 Claims, 8 Drawing Sheets

TIME

TIME

TIME

TIME

US 6,541,954 B1

CIRCUIT APPARATUS FOR SENSING LINE CONDITIONS IN A THREE PHASE POWER LINE

CROSS REFERENCE TO RELATED APPLICATION

Reference is made to and priority claimed from U.S. provisional application Ser. No. 60/136,891 filed Jun. 1, 1999, entitled THREE PHASE POWER MONITOR.

BACKGROUND OF THE INVENTION

1. Field of the Invention

The present invention relates to electrical load protection devices in general and particularly to a device for monitoring line conditions in a three phase power supply line.

2. Background of the Prior Art

Existing power monitoring circuits for monitoring line conductors in a three phase power line typically comprise parallel-connected DC power supplies for powering various circuit components (e.g. indicator components, sensing circuitry components, and relays). This arrangement results in excessive power consumption levels requiring that these circuits be made using high voltage and high cost circuit components. In addition, existing power monitoring circuits must be housed in large, expensive protective housings account for the heating effects attendant to the high power consumption levels.

Efforts in the past to reduce power consumption levels in three phase monitoring circuits have often resulted in further increases in circuit component costs. For example, in U.S. Pat. No. 5,548,207 a power monitoring circuit is described in which the line voltage of the line being monitored is reduced using a three phase step-down isolation transformer. While the circuit features reduced power consumption, it is estimated that the step-down isolation transformer shown in the '207 patent accounts for at least 50 percent of the total costs of the '207 circuit.

There is a need therefore for a three phase power monitor which consumes reduced power, comprises low cost circuit components, is readily packaged in a small, inexpensive housing, and which, at the same time, accurately detects line voltage characteristics.

SUMMARY OF THE INVENTION

According to its major aspects and broadly stated, the invention is a low cost, low power consumption power monitoring circuit for monitoring line conditions in a three phase power supply mains.

The power monitoring circuit includes a signal analyzer and plurality of series-connected power supplies for powering various circuit components, including such components as a signal analyzer and a relay coil. The series connection of the power supplies reduces the power consumption of the circuit, thereby reducing the required voltage ratings and cost of the circuit components as well as reducing the required heat stress rating and cost of the circuit's packaging. According to the invention, the signal input into the signal analyzer for analyzing line conditions is a signal indicative of the current supplying the series-connected power supplies. This current-indicating signal may be developed with use of a current sensor comprising a sensing resistor and voltage divider combination, or another type of current sensor such as a linear optocoupler, a DC current sensor, or a Hall-effect sensor.

A power monitoring circuit according to the invention preferably further includes a plurality of voltage reducing resistors arranged between the power supply mains and the bridge rectifier of the power monitoring circuit. While these voltage reducing resistors operate to reduce voltage applied to some of the circuit components and therefore further reduce component cost, they tend to introduce a distortion component into the input signal input into the circuit's signal analyzer.

In another aspect of the invention, the circuit signal analyzer includes a programmed microprocessor which has been previously programmed to accurately sense line conditions based on the input signal in spite of the presence of a distortion component in the input signal. Specifically, the signal analyzer may include a program having a mathematical formula relating the distorted input signal to line conditions or else may include a programmed lookup table correlating input signals with associated line conditions. The distortion backout program may be developed prior to the circuit being placed into operation by analyzing the current-indicating input signal under various experimentally controlled line conditions.

These and other details, advantages and benefits of the present invention will become apparent from the detailed description of the preferred embodiment hereinbelow.

DETAILED DESCRIPTION OF THE INVENTION

For a better understanding of the invention, it is helpful to first examine some shortcomings of prior art three phase monitoring circuits.

Figure 5A:
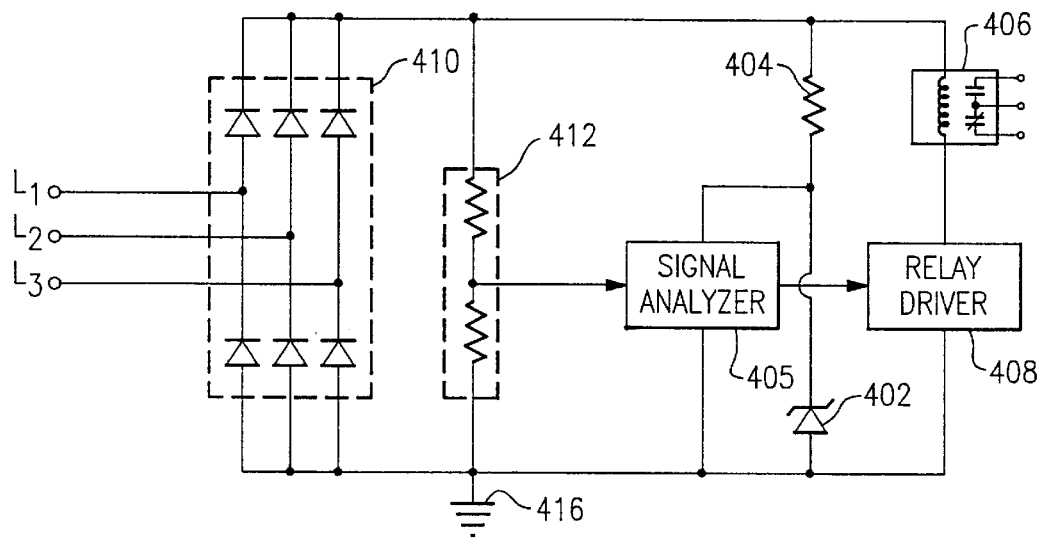
FIGS. 5a and 5b show embodiments of various existing power monitoring circuits.

In the prior art circuit of FIG. 5a a series-connected zener diode 402 and resistor 404 are connected in parallel across series-connected relay 406 and relay driver 408, and in parallel across a three phase bridge rectifier 410. A signal analyzer 405 is powered by the voltage across zener diode 402 and has input thereto the voltage provided by voltage divider 412 which is connected across bridge rectifier 410. Bridge rectifier 410 and zener diode power supply 402 are commonly connected to ground 416. In response to a sensed voltage imbalance, the signal analyzer 405 generates an imbalance signal to trip relay driver 408 and deactivate relay 406.

The parallel connection of relay coil 406 and power supply zener diode 402 results in high power consumption levels and in high voltage stress requiring that the circuit comprise high cost circuit components. The three phase bridge rectifier 410 must be especially rugged in design in the embodiment of FIG. 5a. Three phase bridge rectifier 410 must be able to withstand both the line voltage and line voltage transients.

Figure 5B:
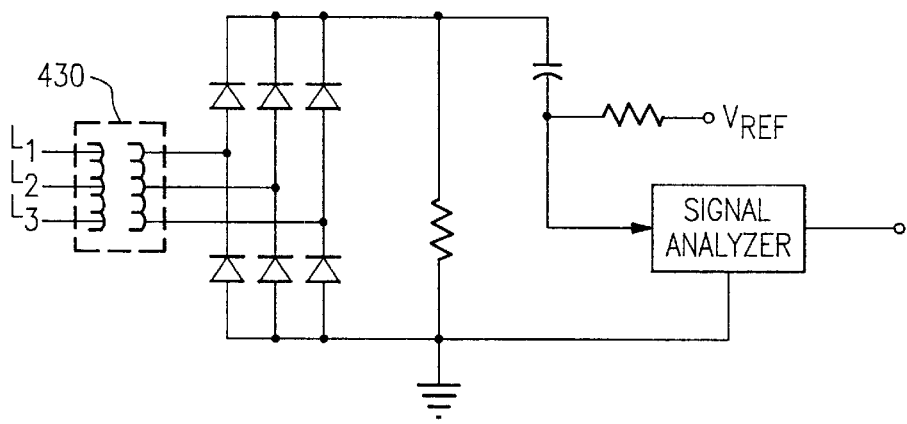

The prior art power monitoring circuit of U.S. Pat. No. 5,548,207 is shown in FIG. 5b. In this circuit, a three phase transformer 430 is provided for reducing the voltage of the primary three phase power line. While the transformer reduces the circuit's power consumption, it is estimated that transformer 430 would account for at least 50 percent of the total circuit cost.

Figure 1A:
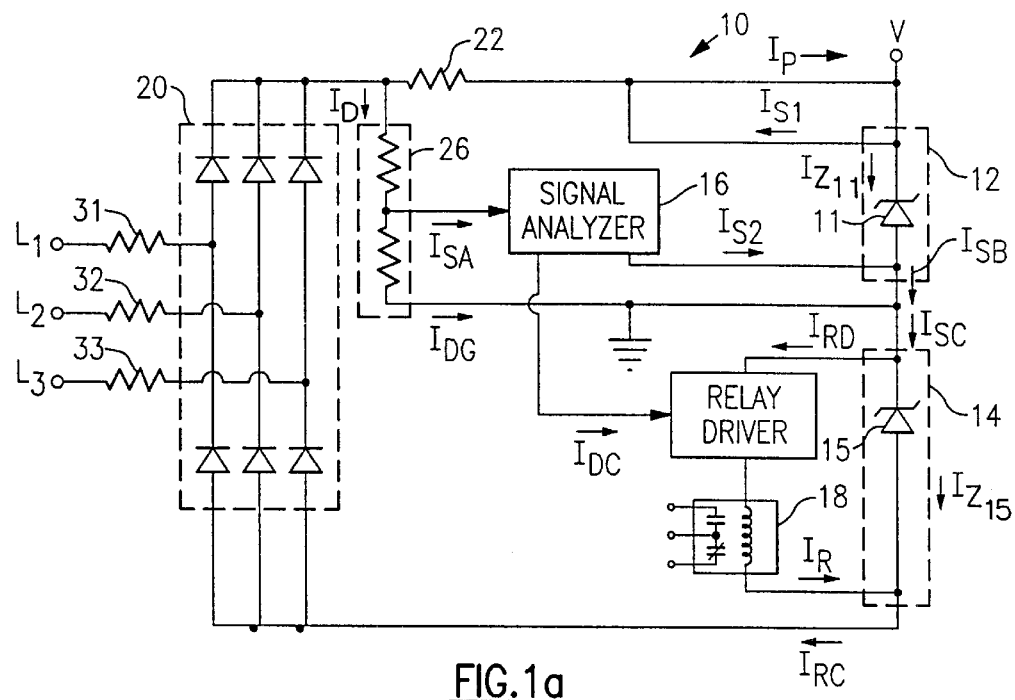
FIGS. 1a and 1b show circuit diagrams of the invention.
Figure 1B:
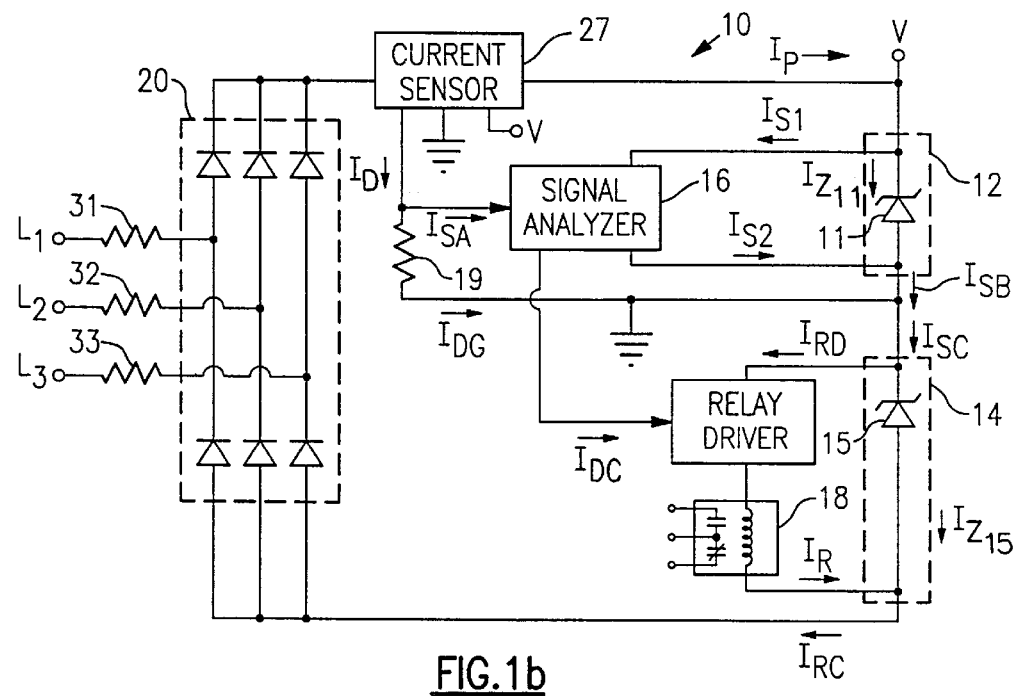
Figure 2:
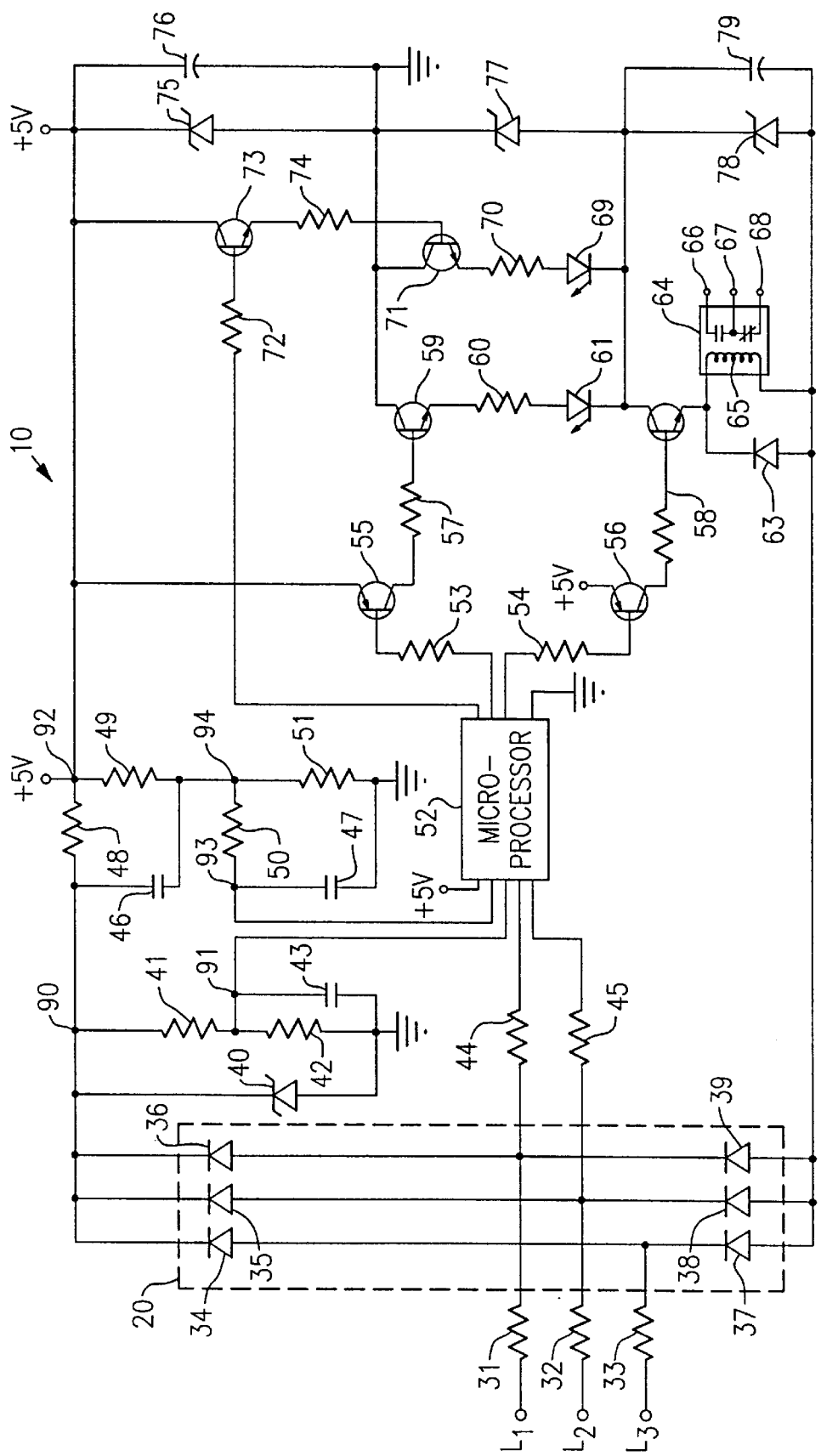
FIG. 2 shows a more specific embodiment of a circuit according to the invention.

Referring now to FIGS. 1a–2, the advantages of the present invention will be explained in detail. A first embodiment of the invention is shown in FIG. 1a. In the embodiment of FIG. 1a power supplies 12 and 14 for powering signal analyzer 16 and relay 18, respectively, are connected in series, and line conditions are sensed by sensing the current, $I_p$, supplying the power supplies. Shown as being provided by zener diodes 11 and 15, power supplies 12 and 14 can be provided by any "shunt type" voltage regulator. The series connection between the power supplies 12 and 14 reduces the maximum power that is consumed by these two power supplies. The series connection of the power supplies thereby reduces the required voltage ratings and cost of the circuit components as well as reducing the required heat stress rating and cost of the circuit's packaging. As will be explained more fully hereinbelow, the series arrangement between the power supplies 12 and 14 also prevents the voltage across rectifier 20 from being substantially influenced by the state of relay 18. Therefore the series arrangement of power supplies 12 and 14 simplifies the task of continual voltage monitoring subsequent to an imbalanced condition being sensed.

While the components for sensing power supply current in the embodiment of FIG. 1a are shown as being provided by a current sensor including a current sensing resistor 22 and voltage divider 26, it will be seen that these components could readily be replaced with alternative current sensing devices. An alternative embodiment of the invention is shown in FIG. 1b, in which element 27 represents an alternative current sensing device such as a linear optocoupler, a DC current sensor, or a Hall-effect sensor. When an alternative current sensing device is used, the circuit must contain an element, e.g. resistors 31, 32 and 33 for limiting current supplied to the power supplies.

The cost of the circuit components of FIG. 1a can be reduced further by providing voltage reducing resistors 31, 32 and 33 at the input of bridge rectifier 20. Resistors 31, 32 and 33 enable the remaining circuit components to operate at lower voltage and prevent the remaining circuit components from being directly exposed to line voltage transients. Most significantly, the voltage reducing resistors reduce the voltage stress encountered by bridge rectifier 20 thereby reducing the required voltage rating and cost of rectifier 20. These resistors should be sized so that there is sufficient current for operation of the relay 18 and signal analyzer at a minimum specified input voltage.

While the current limiting resistors 31, 32 and 33 reduce voltage stress levels and cost of the circuit components, their inclusion in the circuit of FIG. 1a results in a significant distortion component being introduced into the input signal that is input into signal analyzer 16 which in the embodiment of FIG. 1a is a current-indicating input signal. The characteristics of this distortion component are difficult to predict prior to selection of the circuit's specific circuit components and vary significantly depending on the characteristics of the specific circuit components, particularly on the value of resistors 31, 32 and 33 and on the characteristics of power supplies 12 and 14 shown as being provided by zener diodes. FIGS. 4a–4d illustrate the effect of resistors 31, 32 and 33 on the signal analyzer input voltage.

Figure 4A:
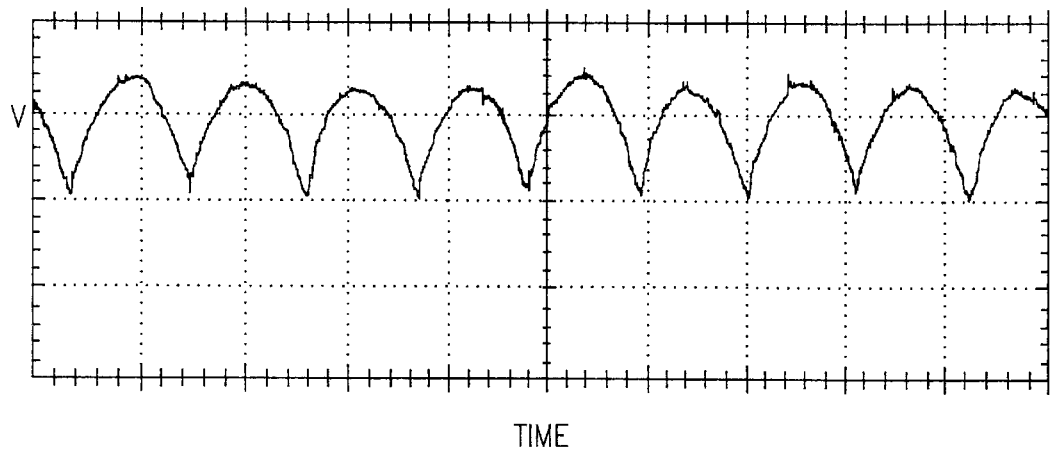
FIGS. 4a–4h show waveforms corresponding to input signals which may be analyzed by a circuit of the invention.
Figure 4B:
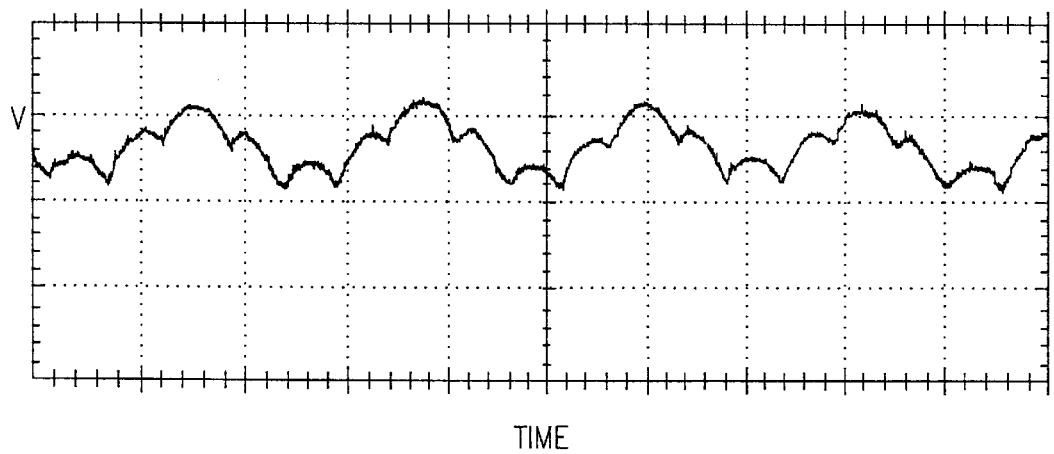
Figure 4C:
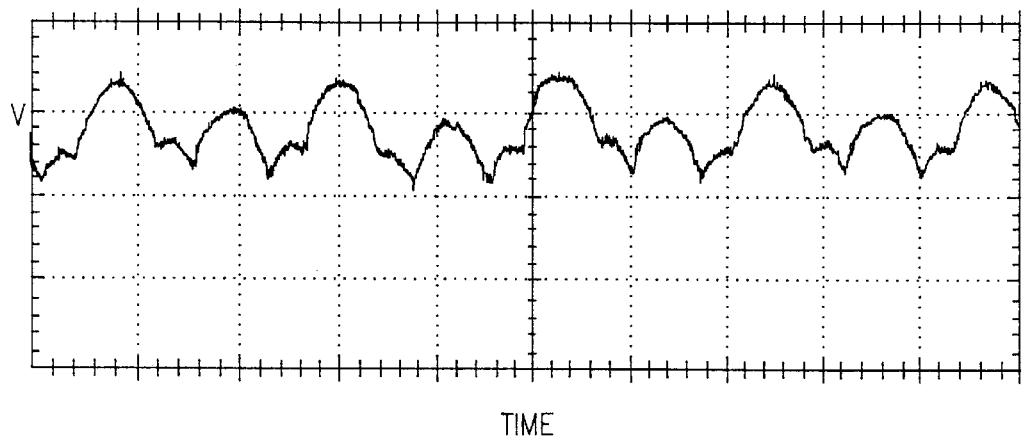
Figure 4D:
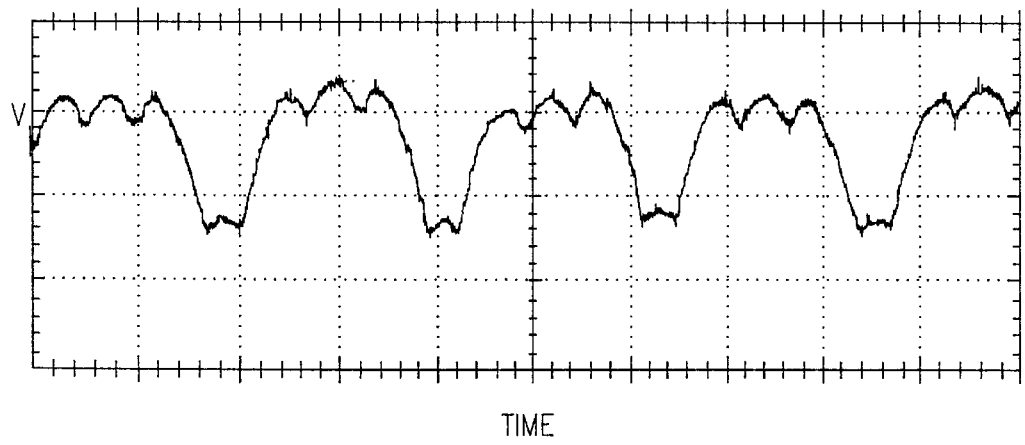

The waveforms of FIGS. 4a–4d represent the input voltage at mode 94 of the circuit of FIG. 2, a specific embodiment of the invention to be described more fully herein below. FIG. 4a shows the analyzer input voltage at node 94, in the case voltage reducing resistors 31, 32 and 33 are removed. It is seen that the input voltage is substantially undistorted when resistors 31, 32 and 33 are removed from the rectifier input. FIGS. 2c–2e show the voltage at node 94 for different values of the resistors $R_{31}=R_{32}=R_{33}$. It is seen that resistors $R_{31}$, $R_{32}$ and $R_{33}$ significantly distort the input voltage in a manner that changes substantially depending on the value of the resistors.

In another aspect of the invention, circuit 10 is adapted to accurately sense line conditions in spite of the presence of a significant distortion component in the circuit's input signal resulting from use of voltage reducing resistors in circuit 10. For sensing line conditions in spite of the presence of a significant distortion component in the circuit's input signal, the signal analyzer 16 of circuit 10 is provided by a programmable microprocessor in communication with a memory having stored therein a distortion backout program that correlates various distorted input signals with associated line conditions. The distortion backout program is preferably established prior to circuit 10 being placed into operation by observing distorted input signal characteristics under various experimentally controlled line conditions.

In one embodiment the distortion backout program includes a mathematical formula or formulas correlating various distorted input signals to associated line conditions. These mathematical formulas may be established by utilizing the difference between Vpp4 (FIG. 4b) and Vpp3 (FIG. 4e) as a measure of the voltage unbalance. For greater accuracy, line voltage compensation may be added, since both Vpp4 and Vpp3 voltages vary with change of the line voltage.

In another embodiment, the distortion backout program includes a lookup table or tables correlating various distorted input signals with associated line condition. A lookup table comprising data representing different levels of voltage unbalance in a three phase power line can be developed by (a) connecting the power monitoring circuit 10 to an adjustable three phase voltage source; (b) adjusting the three phase voltage source to create a specific voltage unbalance level at a given average of three phase voltages; (c) measuring the input signal voltage; (d) converting the measured input signal voltage to a binary value; (e) storing this binary value and an unbalance level indicating value into a table such that the binary value represents the associated specific level of voltage unbalance provided in step (b); and (f) repeating steps (b)–(e) to provide additional table data points comprising correlated binary value and unbalance level indicating values.

Because of the series connection of the power supplies, the characteristics of the input voltage in the circuit of FIGS. 1a–3, although distorted by the presence of resistors 31, 32 and 33 are not substantially affected by the state of relay 18. By contrast, it is seen that if voltage reducing resistors 31, 32 and 33 were implemented in the prior art circuit of FIG. 5a containing parallel-connected power supplies, then the activation and deactivation of relay driver 408 would substantially affect the voltage across bridge rectifier 410 and therefore the voltage that is input into signal analyzer 16.

While the addition of resistors 31, 32, and 33 into circuit 10 substantially distorts the input signal, the input signal is not substantially affected by energization and deenergization of relay 64 as would be the case if the resistors were implemented in the prior art circuit of FIG. 5a. Therefore, it is seen that the series arrangement of power supplies in the circuit of FIGS. 1a–3 simplifies the task of continual voltage monitoring subsequent to an imbalanced condition being sensed. The combination of voltage reducing resistors 31, 32 and 33 and series connected power supplies 12 and 14 reduces the voltage stress encountered by circuit components, reduces the power consumption of the circuit and provides a circuit whose input voltage is well suited for sensing line conditions subsequent to an imbalanced condition being sensed.

A specific embodiment of the invention is shown in FIG. 2. In the circuit FIG. 2, three phase voltage is applied to terminals $L_1$, $L_2$ and $L_3$. Resistors 31, 32 and 33 are of substantially equal value and serve as current limiting components. Rectifier diodes 34, 35, 36, 37, 38 and 39 form a three phase full wave rectifier 20, which supplies voltage for operation of the power monitor. Zener diode 75 and filter capacitor 76 form a first power supply which provides current for operation of a signal analyzer provided by microprocessor 52.

Zener diode 77 serves as a second power supply and provides current for operation of LED diodes 61 and 69. Third power supply consists of zener diode 78 and filter capacitor 79 and provides current for operation of the relay 64.

All three power supplies are connected in series and thus use approximately the same current which is substantially equal to the current flowing through resistor 48. Resistors 41, 42, 44, 45, 49, 51, 53, 54, 57, 58, 72, and 74 have high resistance values, thus current consumed by these components can be neglected. Zener diode 40 protects circuit 10 from damage due to high voltage conditions on three phase lines connected to terminals $L_1$, $L_2$, and $L_3$. The arrangement of the first, second, and third power supplies in series limits maximum voltage applied to the circuit components and reduces power consumption of the device, allowing the device to be made using inexpensive circuit components, and allowing the device to be packaged using a small inexpensive housing.

All three power supplies are shunt-type regulators, so the combined voltage across the three power supplies is constant. Since the voltage across three power supplies is constant, the current flowing through resistor 48 is proportional to three phase line voltages applied to terminals $L_1$, $L_2$ and $L_3$ under all line conditions including unbalanced line conditions.

Combined voltage developed across the current sensing resistor 48 and zener diode 75 is scaled down by the voltage divider consisting of resistor 41 and resistor 42 and converted to DC voltage by a low pass filter consisting of resistor 41 and capacitor 43. This signal represents the average of three phase line voltages and is applied to the first analog input of microprocessor 52.

Resistors 49 and 51 provide bias voltage for AC component signal supplied to microprocessor 52 through coupling capacitor 46. This signal, indicative of the power supply AC component current, represents voltage unbalance of the three phase line voltages. The AC component current-indicating signal is applied through a low pass filter to second analog input of microprocessor 52. Resistor 50 and capacitor 47 form a low pass filter for reducing the effect of high frequency harmonics in three phase lines on accuracy of voltage unbalance measurement.

The utilization of low pass filters comprising components 41, 43, 47 and 50 and the AC component extractor comprising components 46, 49 and 51 results in a full scale unbalance-indicating input signal having a peak-to-peak voltage approximately equal to that of voltage 90, 90' (the characteristics of voltage 90, 90' will be explained more fully herein). Increasing the peak-to-peak voltage of the unbalance-indicating input signal allows the invention to be carried out using a microprocessor having a lower resolution, lower cost analog-to-digital converter.

Resistors 44 and 45 are current limiting components and may be connected to microprocessor 52 for detecting zero crossing of voltages applied to lines $L_1$, and $L_2$. From these two signals, microprocessor 52 determines phase sequence of three phase line voltages. When three phase line voltages are within ranges indicating a balanced line condition, and with proper phase sequence, the microprocessor 52 energizes relay 64 through transistors 56 and 62. Resistor 54 provides base current for transistor 56 and resistor 58 provides base current for transistor 62.

If parameters of three phase line voltages are outside the desired values, relay 64 is deenergized and a fault indicia will be displayed by LEDs 61 and 69. For example, LED 61 may indicate phase reversal and LED 69 may indicate voltage unbalance. Resistors 60 and 70 in the embodiment shown set desired current levels for LED 61 and LED 69 respectively. Transistors 55, 59, 71 and 73 control operation of the LEDs while resistors 53, 57, 72 and 74 provide base currents for transistors 55, 59, 71 and 73 respectively. Diode 63 is a free wheeling diode for relay coil 65. Terminals 66, 67 and 68 are connected to normally open and normally closed contacts of the relay 64.

Figure 4E:
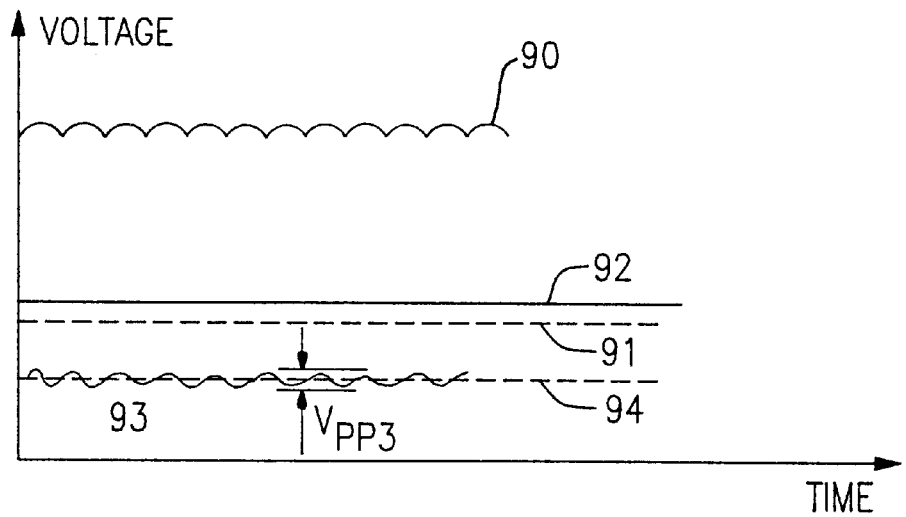
Figure 4F:
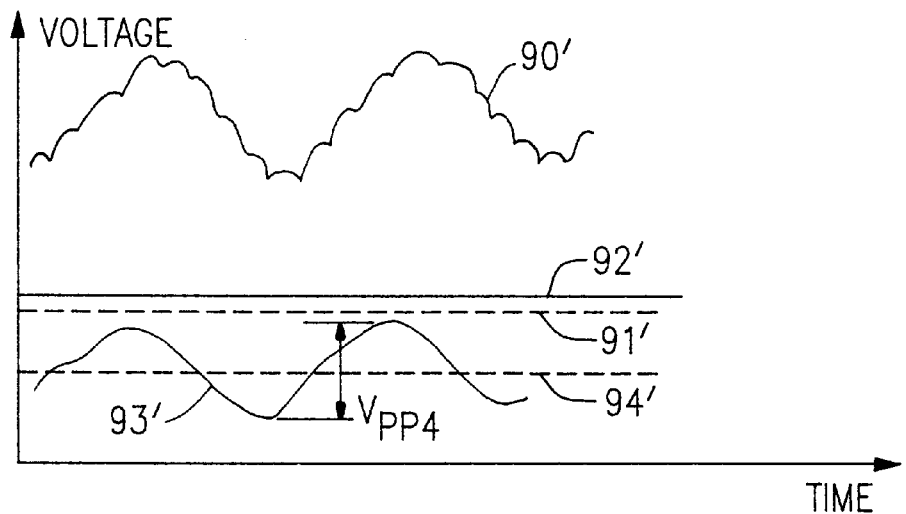

FIGS. 4e and 4f show a set of voltage waveforms helpful in explaining operation of the apparatus. All waveforms are shown in reference to the circuit ground, which is connected to the anode of zener diode 75.

Voltage waveforms shown in FIG. 4e apply to conditions wherein three phase line voltages are balanced.

Waveform 90 is scaled down by a voltage divider formed by resistors 41 and 42 and converted to DC voltage which is present across capacitor 43. This voltage is shown as waveform 91 and represents the average of three phase line voltages and is applied to the first analog input of microprocessor 52. Waveform 94 represents bias voltage developed across resistor 51. Waveform 93 is obtained by superimposing the AC component of waveform 90 on bias voltage 94 and by reducing higher frequency components with the help of a low pass filter consisting of resistor 50 and capacitor 47. Vpp3 is a peak-to-peak value of the waveforms 93 and represents 0% voltage unbalance.

FIG. 4f shows the above waveforms as they may appear in a typical unbalanced line condition. Waveforms 90, 91, 92, 93 and 94 shown in FIG. 4e under a balanced line condition are shown under an imbalanced line condition in FIG. 4f as waveforms 90', 91', 92', 93', and 94', respectively.

For constant values of the circuit components, the peak-to-peak value (Vpp) of the waveform 93, is a function of: voltage between phase A and phase B (Vab), voltage between phase B and phase C (Vac), voltage between phase A and phase C (Vac) and line frequency F. The peak-to-peak value (Vpp) of the waveform 93', increases when voltage unbalance is increasing.

Phases A, B, C are connected to terminals $L_1$, $L_2$ and $L_3$ respectively.

The peak-to-peak value (Vpp) can be expressed as:

$$Vpp = f(Vab, Vbc, Vac, F)$$

From the Vpp value of waveform 93', the microprocessor can find the magnitude of voltage unbalance through calculations or from a lookup table stored in microprocessor program memory.

From the waveform 91, the microprocessor can find the average value of three phase line voltages through calculations or from a lookup table stored in microprocessor system's program memory.

Figure 3:
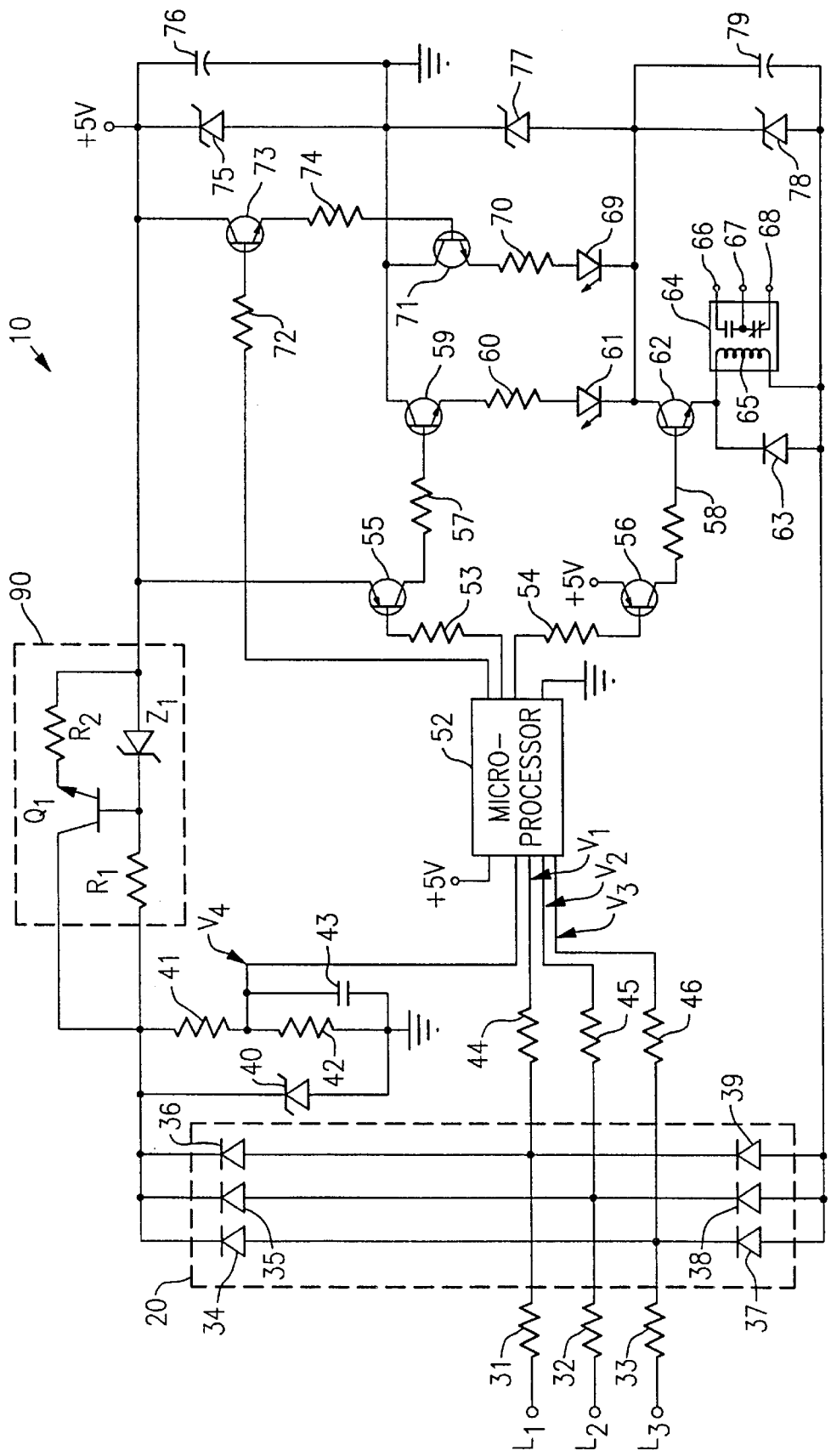
FIG. 3 shows an embodiment of the invention including a constant currents source.

In an alternative embodiment of the invention shown in FIG. 3, the current sensor of the embodiments of FIGS. 1a–2 is replaced by a constant current source 90 connected in series with the series-connected power supplies of the circuit. In this embodiment, the signal input into microprocessor 52 for sensing line conditions is indicative of the voltage drop across the constant current source. This current source voltage drop indicating signal may be developed with use of the voltage divider comprising resistors 41 and 42.

Figure 4G:
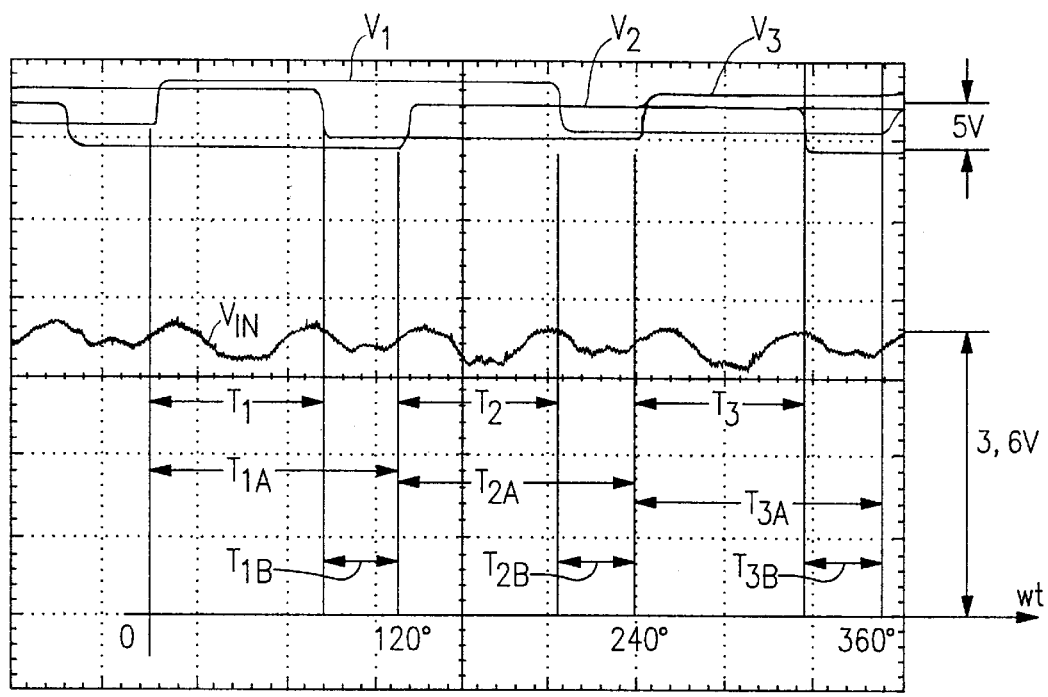
Figure 4H:
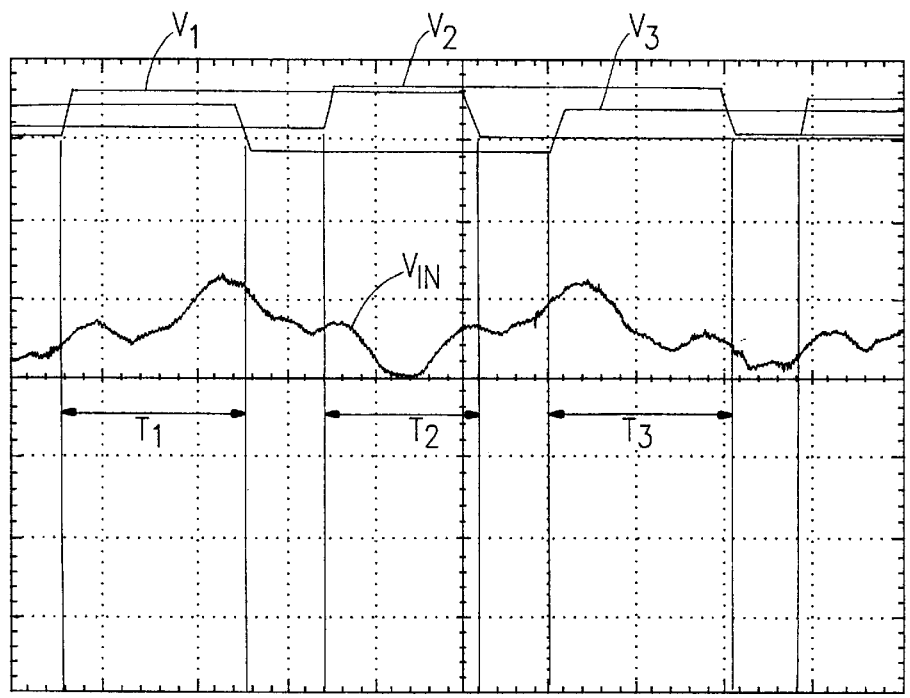

An alternative method for sensing line conditions based on various combinations of input signals is shown described with the waveform diagrams of reference to FIGS. 4g and 4h. In an alternative method of sensing line conditions, a third zero crossing signal for sensing the zero-crossing characteristic of line 3, can be input into microprocessor 52, as is indicated by the conductor including current limiting resistor 46 of FIG. 3. FIG. 4g shows waveforms corresponding to the zero crossing signal for each of the 3 lines, line 1, line 2, and line 3 plotted against an input signal V, under a balanced line condition, while FIG. 4h shows waveforms corresponding to zero crossing signal for each of the three lines plotted against an input signal V, under an unbalanced line condition. When zero crossing signals corresponding to each of the three lines are input into microprocessor 52, timing periods $T_1$, $T_2$, and $T_3$ can be established based on the zero-crossing signals as is indicated by waveform diagram of FIG. 4g, and unbalanced line conditions can be monitored for by analyzing the input signal during each of the timing periods. Of course, other timing periods can be established based on relationships between $V_1$, $V_2$ and $V_3$, as is indicated by timing periods $T_{1A}$, $T_{2A}$ and $T_{3A}$ and timing periods $T_{1B}$, $T_{2B}$ and $T_{3C}$ of FIG. 4g. The input signal, v shown in FIGS. 4g and 4h, is the input signal of the constant current source embodiment of the invention described in FIG. 3. However it will be understood that the method requiring a third zero crossing signal can also be employed to sense line conditions using the embodiments of FIGS. 1a–2. It will be understood further that the line condition sensing methods described in connection with the waveform diagrams of FIGS. 4g and 4h can also be used to sense line conditions in the constant current source embodiment of the invention shown in FIG. 3.

While this invention has been described with reference to the specific embodiments, it is not intended to be limited to the details shown, since various modifications are possible without departing from the spirit of the present invention.

In the claims:

1. A power monitoring circuit for monitoring line conditions in a three phase power line, said power monitoring circuit comprising:
   at least one power supply;
   a current sensor connected in series with said at least one power supply, for sensing current supplied to said power supply;
   a three phase bridge rectifier adapted for communication with said power line, connected in parallel across said series-connected power supply and current sensing element arrangement; and
   a signal analyzer responsive to an input signal developed by said current sensing element, for sensing line conditions of said three phase power line.

2. The circuit of claim 1, wherein said circuit further includes first, second and third voltage reducing resistors disposed at an input of said bridge rectifier, for reducing voltage stress levels encountered by said bridge rectifier.

3. The circuit of claim 1, further including first, second and third voltage reducing resistors disposed at an input of said bridge rectifier, for reducing voltage stress levels encountered by said rectifier, said voltage reducing resistors introducing a significant distortion component into said input signal, wherein said signal analyzer includes a programed microprocessor having a distortion backout program correlating distorted input signals with various line conditions, so that said signal analyzer accurately senses line conditions in spite of said significant distortion component.

4. The circuit of claim 1, wherein said distortion backout program includes a mathematical formula correlating distorted input signals with various line conditions.

5. The circuit of claim 1, wherein said distortion backout program includes a lookup table correlating distorted input signals with various line conditions.

6. The circuit of claim 1, wherein said at least one power supply power supplies comprises a zener diode.

7. The circuit of claim 1, wherein said at least one power supply powers a relay coil.

8. The circuit of claim 1, wherein said at least one power supply powers said signal analyzer, said wherein said one power supply powering said signal analyzer is connected to ground.

9. The circuit of claim 1, wherein said current sensing element is a current sensing resistor.

10. The circuit of claim 1, wherein said current sensing element is a linear optocoupler.

11. The circuit of claim 1, wherein said current sensing element is a Hall-effect sensor.

12. The circuit element of claim 1, wherein said current sensing element is a DC current sensor.

13. A power monitoring circuit for monitoring line conditions in a three phase power line, said power monitoring circuit comprising:
   at least one power supply;
   a three phase bridge rectifier adapted for communication with said power line, for powering at least one power supply;
   a first input signal generating element for generating a first input signal indicative of said line conditions; and
   a microprocessor system, powered by said at least one power supply for sensing line conditions based at least in part on said input signal.

14. The circuit of claim 13, further comprising three voltage reducing resistors disposed at the input of said bridge rectifier, said voltage reducing resistors reducing voltage across said bridge rectifier while introducing a significant distortion component into said input signal, wherein said microprocessor system includes distortion backout program correlating distorted input signals with various line conditions so that said microprocessor system accurately senses line conditions in spite of said distortion component.

15. The circuit of claim 14, wherein said distortion backout program includes a mathematical formula correlating distorted input signals with various line conditions.

16. The circuit of claim 14, wherein said distortion backout program includes a lookup table correlating distorted input signals with various line conditions.

17. The circuit of claim 13, wherein said microprocessor system further has input the first, second, and third zero crossing signals, wherein said microprocessor system determines first second and third timing periods based on said zero crossing signals, and senses line conditions by monitoring for changes in said input signal between said first, second and third timing periods.

18. The circuit of claim 13 further comprising a second input signal generating element generating a second input signal, wherein said first input signal is indicative of a voltage imbalance of said line, and said second signal is a DC voltage indicative of the average voltage of said three phase line, wherein said microprocessor system receives both of said first and second signals whereby a resolution requirement of an analog-to-digital converter of said microprocessor system is reduced.

19. A method for sensing line conditions of a three phase power line, said method comprising the steps of:
   providing at least one power supply;
   powering said at least one power supply with power supplied by a three phase bridge rectifier in communication with said three phase power line;
   detecting current flowing through said at least one power supply; and
   sensing line conditions based at least in part on said detected current.

20. A power monitoring circuit for monitoring line conditions in a three phase power line, said power monitoring circuit comprising:
   at least one of series-connected power supply;
   a constant current source connected in series with said at least one power supply;
   a voltage drop sensor for generating an input signal indicative of a voltage drop across said constant current source; a three phase bridge rectifier in communication with said power line, connected in parallel across said series-connected power supply and constant current source arrangement; and
   a circuit analyzer responsive to said voltage drop-indicating input signal, for sensing line conditions in said three phase power line.

21. The circuit of claim 20, wherein said circuit further includes first, second and third voltage reducing resistors disposed at an input of said bridge rectifier, for reducing voltage stress levels encountered by said bridge rectifier.

22. The circuit of claim 20, further including first, second and third voltage reducing resistors disposed at an input of said bridge rectifier, for reducing voltage stress levels encountered by said rectifier, said voltage reducing resistors introducing a significant distortion component into said input signal, wherein said signal analyzer includes a programed microprocessor having a distortion backout program correlating distorted input signals with various line conditions, so that said signal analyzer accurately senses line conditions in spite of said significant distortion component.

23. The circuit of claim 20, wherein said distortion backout program includes a mathematical formula correlating distorted input signals with various line conditions.

24. The circuit of claim 20, wherein said distortion backout program includes a lookup table correlating distorted input signals with various line conditions.

25. The circuit of claim 20, wherein said at least one power supply comprises a zener diode.

26. The circuit of claim 20, wherein said at least one power supply plurality of powers a relay coil.

27. The circuit of claim 20, wherein said at least one power supply powers said signal analyzer, said wherein said at least one power supply powering said signal analyzer is connected to ground.

28. The circuit of claim 20, wherein said at least one power supply is a plurality of series-connected power supplies.

29. The circuit of claim 13, wherein said at least one power supply is a plurality of series-connected power supplies.

30. The method of claim 19, wherein said providing step includes the step of providing a plurality of series-connected power supplies.

31. The circuit of claim 20, wherein said at least one power supply is a plurality of series-connected power supplies.

32. A power monitoring circuit for monitoring line conditions in a three phase power line, said power monitoring circuit comprising:
   at least one internal circuit power supply;
   a current sensing element carrying substantially a current supplied to said at least one internal circuit power supply for sensing current supplied to said internal circuit power supply;
   a three phase bridge rectifier adapted for communication with said power line, connected in parallel across said internal circuit power supply and current sensing element arrangement; and
   a signal analyzer responsive to an input signal developed by said current sensing element, for sensing line conditions of said three phase power line.

33. The circuit of claim 32, wherein said circuit further includes first, second and third voltage reducing resistors disposed at an input of said bridge rectifier, for reducing voltage stress levels encountered by said bridge rectifier.

34. The circuit of claim 32, further including first, second and third voltage reducing resistors disposed at an input of said bridge rectifier, for reducing voltage stress levels encountered by said rectifier, said voltage reducing resistors introducing a significant distortion component into said input signal, wherein said signal analyzer includes a programed microprocessor having a distortion backout program correlating distorted input signals with various line conditions, so that said signal analyzer accurately senses line conditions in spite of said significant distortion component.

35. The circuit of claim 34, wherein said distortion backout program includes a mathematical formula correlating distorted input signals with various line conditions.

36. The circuit of claim 32, wherein said distortion backout program includes a lookup table correlating distorted input signals with various line conditions.

37. The circuit of claim 32, wherein said at least one internal circuit power supply comprises a zener diode.

38. The circuit of claim 32, wherein said at least one internal circuit power supply a relay coil.

39. The circuit of claim 32, wherein said at least one internal circuit power supply powers said signal analyzer.

40. The circuit of claim 32, wherein said current sensing element is a current sensing resistor.

41. The circuit of claim 32, wherein said current sensing element is a linear optocoupler.

42. The circuit of claim 32, wherein said current sensing element is a Hall-effect sensor.

43. The circuit element of claim 32, wherein said current sensing element is a DC current sensor.

44. The circuit of claim 32, wherein said at least one internal circuit power supply comprises a plurality of internal circuit power supplies.

45. A power monitoring circuit for monitoring line conditions in a three phase power line, said power monitoring circuit comprising:
   at least one internal circuit power supply;
   a three phase bridge rectifier adapted for communication with said power line, for powering said at least one internal circuit power supply;

a first input signal generating element for generating a first input signal indicative of said line conditions; and a microprocessor system, powered by said at least one internal circuit power supply for sensing line conditions based at least in part on said input signal.

46. The circuit of claim 45, further comprising three voltage reducing resistors disposed at the input of said bridge rectifier, said voltage reducing resistors reducing voltage across said bridge rectifier while introducing a significant distortion component into said input signal, wherein said microprocessor system includes distortion backout program correlating distorted input signals with various line conditions so that said microprocessor system accurately senses line conditions in spite of said distortion component.

47. The circuit of claim 46, wherein said distortion backout program includes a mathematical formula correlating distorted input signals with various line conditions.

48. The circuit of claim 46, wherein said distortion backout program includes a lookup table correlating distorted input signals with various line conditions.

49. The circuit of claim 45, wherein said microprocessor system further has input the first, second, and third zero crossing signals, wherein said microprocessor system determines first second and third timing periods based on said zero crossing signals, and senses line conditions by monitoring for changes in said input signal between said first, second and third timing periods.

50. The circuit of claim 45, further comprising a second input signal generating element generating a second input signal, wherein said first input signal is indicative of a voltage imbalance of said line, and said second signal is a DC voltage indicative of the average voltage of said three phase line, wherein said microprocessor system receives both of said first and second signals whereby a resolution requirement of an analog-to-digital converter of said microprocessor system is reduced.

51. The circuit of claim 45, wherein said at least one internal circuit power supply comprises a plurality of internal circuit power supplies.

52. A method for sensing line conditions of a three phase power line, said method comprising the steps of:

providing at least one internal circuit power supply;

powering said at least one internal circuit power supply with power supplied by a three phase bridge rectifier in communication with said three phase power line;

detecting current flowing through said at least one internal circuit power supply; and sensing line conditions based at least in part on said detected current.

53. The method of claim 52, wherein said providing step includes the step of providing a plurality of internal circuit power supplies sharing substantially a common current value.

54. A power monitoring circuit for monitoring line conditions in a three phase power line, said power monitoring circuit comprising:

at least one internal circuit power supply;

a constant current source carrying substantially a current carried by said at least one internal circuit power supply;

a voltage drop sensor for generating an input signal indicative of a voltage drop across said constant current source;

a three phase bridge rectifier in communication with said power line, connected in parallel across said at least one internal circuit power supply and constant current source arrangement; and a circuit analyzer responsive to said voltage drop-indicating input signal, for sensing line conditions in said three phase power line.

55. The circuit of claim 54, wherein said circuit further includes first, second and third voltage reducing resistors disposed at an input of said bridge rectifier, for reducing voltage stress levels encountered by said bridge rectifier.

56. The circuit of claim 54, further including first, second and third voltage reducing resistors disposed at an input of said bridge rectifier, for reducing voltage stress levels encountered by said rectifier, said voltage reducing resistors introducing a significant distortion component into said input signal, wherein said signal analyzer includes a programed microprocessor having a distortion backout program correlating distorted input signals with various line conditions, so that said signal analyzer accurately senses line conditions in spite of said significant distortion component.

57. The circuit of claim 54, wherein said distortion backout program includes a mathematical formula correlating distorted input signals with various line conditions.

58. The circuit of claim 54, wherein said distortion backout program includes a lookup table correlating distorted input signals with various line conditions.

59. The circuit of claim 54, wherein said at least one internal circuit power supply comprises a shunt type voltage regulator.

60. The circuit of claim 54, wherein said at least one internal circuit power supply powers a relay coil.

61. The circuit of claim 54, wherein said at least one internal circuit power supply supplies power to said signal analyzer.

62. The circuit of claim 54, wherein said at least one internal circuit power supply comprises a plurality of internal circuit power supplies.

* * * * *